United States Patent
Wu et al.

[11] Patent Number: 6,071,762
[45] Date of Patent: Jun. 6, 2000

[54] PROCESS TO MANUFACTURE LDD TFT

[75] Inventors: Hong-Woei Wu, Chung-Li; Yeong-E Chen; Gwo-Long Lin, both of Hsinchu, all of Taiwan

[73] Assignee: Industrial Technology Research Institute, Hsin-Chu, Taiwan

[21] Appl. No.: 09/192,453

[22] Filed: Nov. 16, 1998

[51] Int. Cl.⁷ .............................. H01L 21/00; H01L 21/26
[52] U.S. Cl. .......................... 438/151; 438/158; 438/163; 438/535; 438/555
[58] Field of Search ..................................... 438/150, 151, 438/158, 163, 172, 535, 555

[56] References Cited

U.S. PATENT DOCUMENTS

| | | | |
|---|---|---|---|
| 4,609,407 | 9/1986 | Masao et al. | 148/1.5 |
| 5,545,584 | 8/1996 | Wuu et al. | 437/52 |
| 5,612,235 | 3/1997 | Wu et al. | 437/41 |
| 5,618,741 | 4/1997 | Young et al. | 438/151 |
| 5,648,277 | 7/1997 | Zhang et al. | 437/21 |
| 5,716,871 | 2/1998 | Yamazaki et al. | 437/195 |
| 5,896,724 | 11/1999 | Akiyama et al. | 349/42 |
| 5,969,377 | 10/1999 | Seo | 257/72 |

*Primary Examiner*—Richard Elms
*Assistant Examiner*—Michael S. Lebentritt
*Attorney, Agent, or Firm*—George O. Saile; Stephen B. Ackerman

[57] ABSTRACT

A process for manufacturing a TFT without the use of ion implantation is described. Instead, heavily doped layers of amorphous silicon are used as diffusion sources. Two embodiments of the invention are described. In the first embodiment the gate pedestal is deposited first, followed by gate oxide and an amorphous layer of undoped silicon. This is followed by the layer of heavily doped amorphous silicon which is subjected to a relatively low energy laser scan which drives in a small amount of dopant and converts it to N−. After the N+ layer has been patterned and etched to form source and drain electrodes, a second, higher energy, laser scan is given. This brings the source and drain very close to, but not touching, the channel, resulting in an LDD type of structure. In the second embodiment a layer of intrinsic polysilicon is used for the channel. It is covered with a layer of gate oxide and a metallic gate pedestal. As before, heavily doped N+ amorphous silicon is deposited over this and used as a source of dopant to produce an LDD structure similar to the first embodiment.

19 Claims, 4 Drawing Sheets

PROCESS TO MANUFACTURE LDD TFT

FIELD OF THE INVENTION

The invention relates to the general field of thin film transistors with particular reference to cost effective methods for their manufacture.

BACKGROUND OF THE INVENTION

Thin film transistors (TFTs) are widely used in situations where conventional (single crystal) devices are not economical or practical. A typical example would be in the active matrix of a liquid crystal display. Typically, polysilicon is used for the active material to form the channel. To provide maximum resistivity this layer is undoped (intrinsic). It is deposited either above or below a metallic gate electrode with a layer of gate oxide interposed between them. In order to form source and drain regions in the amorphous silicon on opposing sides of the gate electrode, it has been standard practice in the art to make use of ion doping to accomplish this. This makes for a relatively expensive process which for certain classes of mass produced product could make the latter non-competitive. The present invention provides a method for doping the source and drain regions at lower cost and involving a lower energy budget.

In the course of searching for prior art, no teachings along the exact lines of the present invention were found. Several references of general interest were however encountered. For example, in U.S. Pat. No. 5,616,741, Young et al. form a field relief region through lateral diffusion of material from a conventionally formed (ion implanted) source region. Similarly, while Wu et al. (U.S. Pat. No. 5,612,235) use laser annealing to form a polysilicon layer, the source and drain regions are conventionally formed through ion implantation. Masao et al. (U.S. Pat. No. 4,609,407) show how a single crystal layer may be formed from a poly layer by annealing with a laser beam.

SUMMARY OF THE INVENTION

It has been an object of the present invention to provide a process for manufacturing a thin film transistor.

Another object of the invention has been that said process not require the use of ion implantation or an ion doping system.

A still further object has been that the structure produced by said process be a field effect transistor of the LDD (lightly doped drain) type.

These objects have been achieved by the use of heavily doped layers of amorphous silicon as diffusion sources. Two embodiments of the invention are described. In the first embodiment the gate pedestal is deposited first followed by gate oxide and an amorphous layer of undoped silicon. This is followed by the layer of heavily doped amorphous silicon which is subjected to a relatively low energy laser scan which drives in a small amount of dopant and converts it to N−. After the N+ layer has been patterned and etched to form source and drain electrodes, a second, higher energy, laser scan is given. This brings the source and drain very close to, but not touching, the channel, resulting in an LDD type of structure. In the second embodiment a layer of intrinsic polysilicon is used for the channel. It is covered with a layer of gate oxide and a metallic gate pedestal. As before, heavily doped N+ amorphous silicon is deposited over this and used as a source of dopant to produce an LDD structure similar to the first embodiment.

DESCRIPTION OF THE PREFERRED EMBODIMENTS

As indicated above, the present invention teaches how a thin film transistor may be manufactured without the use of ion implantation. Instead, selected regions of a layer of undoped amorphous silicon are transformed into N+ or N− material by overcoating them with a layer of heavily doped amorphous silicon and then diffusing dopant into the amorphous layer through local heating produced by laser scanning. This general approach eliminates the need for ion implantation and avoids subjecting the total structure to high temperatures. The process is described in greater detail in the form of two embodiments.

First Embodiment

The process of the first embodiment begins with the deposition of a layer of metal onto an insulating substrate. For the substrate the most widely used material has been glass but other materials such as plastic could also have been used. Our preferred material for the metal has been chromium but any metal such as molybdenum, tungsten, or aluminum could also have been used. The thickness of this metal layer is between about 2,000 and 3,000 Angstroms, with about 2,000 Angstroms being preferred.

Figure 1:
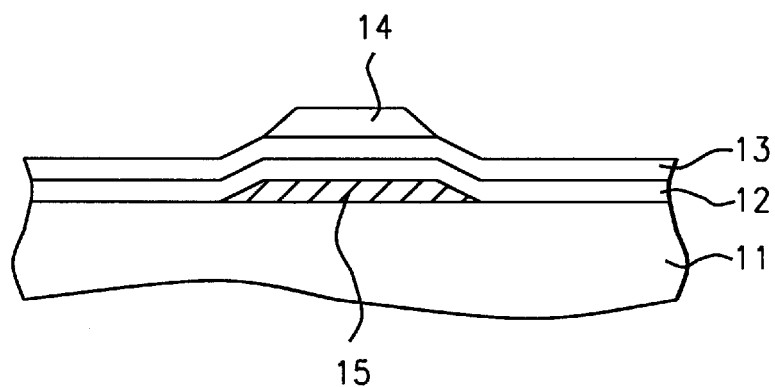
FIG. 1 illustrates the beginning of the process for manufacturing the first embodiment and shows a metal gate covered with a layer of gate oxide, amorphous silicon, and a protective barrier layer of silicon oxide.

Using conventional photolithographic methods, the metal layer is patterned and etched to form a gate pedestal. FIG. 1 shows a cross-sectional view of a gate pedestal 15 which has been deposited onto insulating substrate 11.

Continuing our reference to FIG. 1, once the gate has been formed a layer of gate oxide 12 is deposited over the entire surface followed by a layer of undoped amorphous silicon 13. Layer 12 has a thickness between about 1,000 and 1,500 Angstroms, with about 1,000 Angstroms being preferred while layer 13 is typically about 500 Angstroms thick but any thickness between about 200 and 1,000 Angstroms would still work. The method used for depositing amorphous silicon was PECVD (plasma enhanced chemical vapor deposition). The resistivity of this layer is between about $10^9$ and $10^{11}$ ohm cm. Next, a layer of insulating material (typically silicon oxide), which we will refer to as barrier oxide, is deposited to a thickness between about 1,500 and 2,000 Angstroms, and then patterned (using back-side exposure of the photoresist) and etched so that all that remains of the barrier oxide is the portion that directly overlies gate pedestal 15. This is shown as 14 in FIG. 1.

Figure 2:
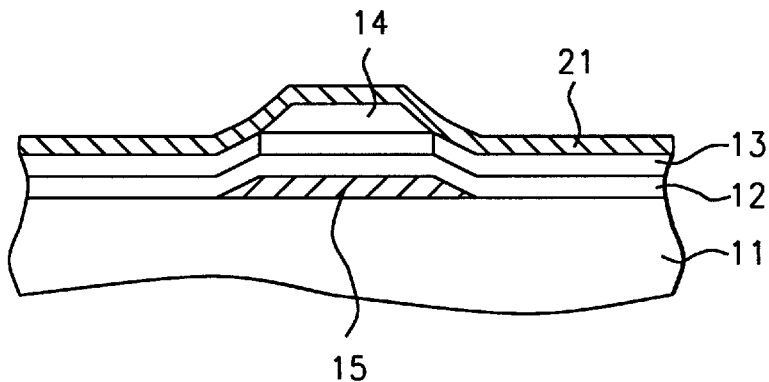
FIG. 2 shows the structure of FIG. 1 after the deposition of a layer of heavily doped N+ amorphous silicon.
Figure 3:
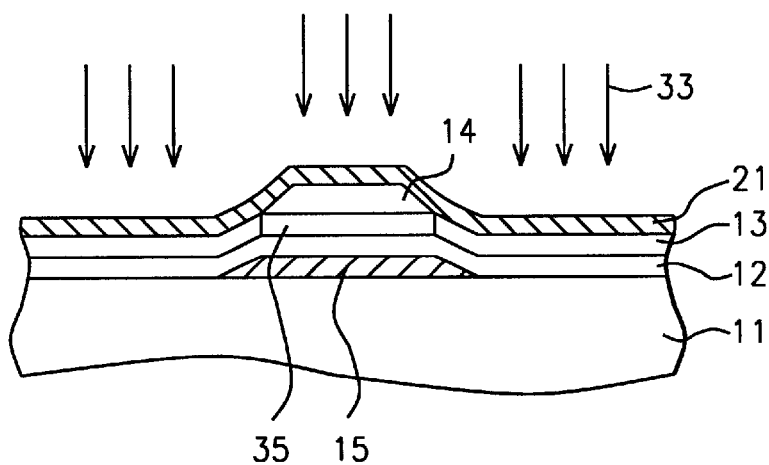
FIG. 3 illustrates the application of a laser scan to the top layer.

Referring now to FIG. 2, layer 21 N+ amorphous silicon is deposited to a thickness that is between about 100 and 200 Angstroms. The sheet resistance of the N+ layers was between about $10^8$ and $10^8$ ohm per square. This layer will now serve as a source of N dopant material for the formation of the source and drain. Transfer of the dopant is achieved by laser scanning layer 21. For this we have used an excimer laser. Scanning is achieved using a beam width between about 50 and 200 microns scanned at a rate of between about 0.4 and 0.6 centimeters per second which corresponds to an energy level of between about 100 and 150 mJ/cm$^2$. This is illustrated in FIG. 3 where the laser beam is symbolically shown by arrows 33. As a consequence of the laser scanning, layer 13, formerly undoped or intrinsic, becomes lightly doped (between about $10^{12}$ and $5\times10^{13}$ donors per cc) and is therefore characterized as N−. Note that section 35 of layer 13, which is not in contact with layer 21, remains unchanged because of the intervening presence of barrier 14.

Figure 4:
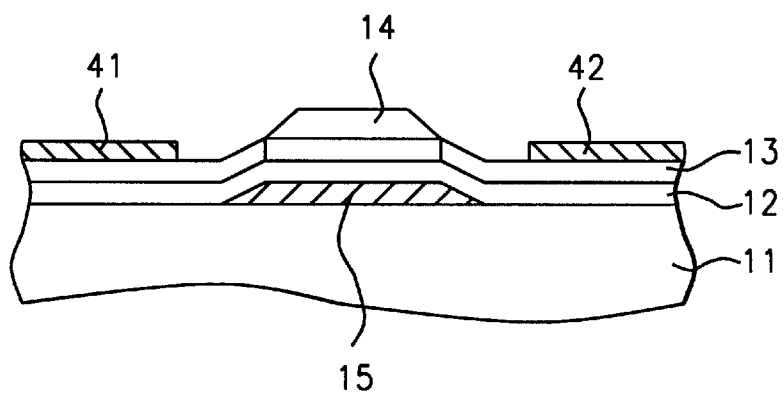
FIG. 4 shows the structure after source and drain regions have been formed.

The next step in the process is illustrated in FIG. 4. Layer 21 is patterned and etched into separate electrodes 41 and 42 for source and drain respectively. Additionally barrier 14 is removed, its purpose having been served.

Figure 5:
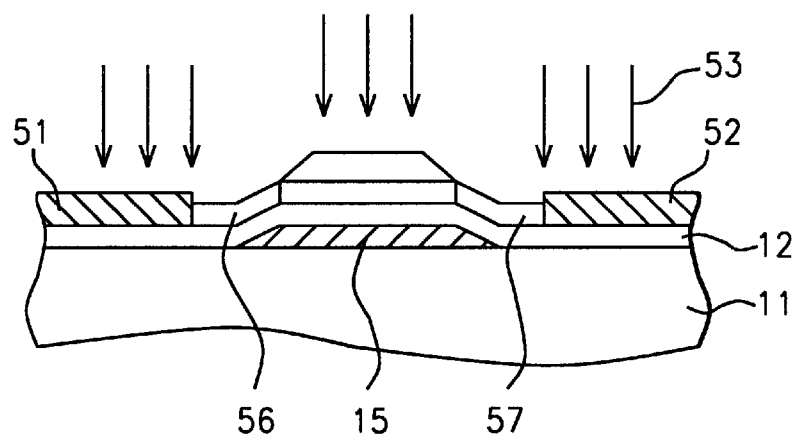
FIG. 5 illustrates the application of a second laser scanning step.

Referring now to FIG. 5, a second laser scan is introduced, this time at the higher energy level of between about 250 and 350 mJ/cm$^2$ with the latter value being preferred. Under these conditions the donor ions in electrodes 41 and 42 become uniformly distributed between the two contacting layers so that the electrodes, 51 and 52, now extend all the way to N− layer 13. Thus, the finished device as seen in FIG. 5, now has a LDD structure since the major portion of the source and drain are of high conductivity (electrodes 51 and 52) while the relatively short segment within layer 13 between termination of the electrodes and the beginning of the channel (regions 56 and 57) is of high resistivity material. The separation between 56 (or 57) and the edge of gate pedestal 15 was generally between about 1 and 4 microns with about 3 microns being typical.

Second Embodiment

Figure 6:
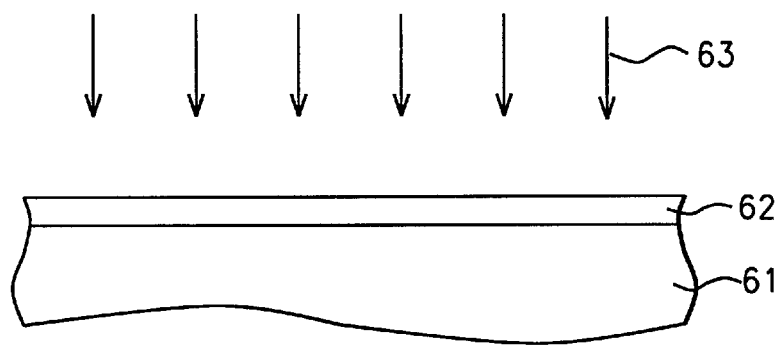
FIG. 6 is the starting point for the process of manufacturing the second embodiment and shows the recrystallization of an amorphous silicon layer by means of laser scanning.

In an alternative version of the device, the gate pedestal is the final layer rather than being in contact with the substrate. In the description that follows any measurement or characterization of the structure that is not explicitly given may be assumed to be identical to the corresponding part of the structure in the first embodiment. The process begins as shown in FIG. 6, with the deposition of an undoped layer of amorphous silicon 62 onto insulating substrate 61. Layer 62 is given a laser scan (shown symbolically by arrows 63). The energy level for this scan is between about 250 and 350 mJ/cm$^2$ which is sufficient to recrystallize layer 62 and convert it to polysilicon. The thickness of layer 62 is between about 300 and 1,000 Angstroms and it needs to be transformed to polysilicon for optimal performance of the TFT.

Figure 7:
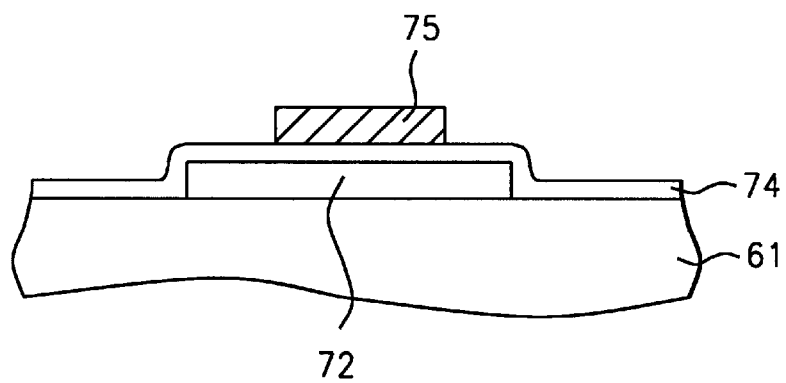
FIG. 7 shows how gate oxide and gate pedestal are deposited and formed.

Referring now to FIG. 7, layer 62 is patterned and etched into a shape 72 that will determine the final size of the TFT. The thickness of layer 72 is between about 300 and 1,000 Angstroms with a thickness of about 500 Angstroms being preferred. Shape 72 is now covered with layer 74 of gate oxide which is deposited to a thickness between about 1,000 and 1,500 Angstroms, with about 1,000 Angstroms being preferred. This is followed by the deposition of a metal layer which is then patterned and etched to form gate pedestal 75. The preferred metal for layer 75 was chromium but any metal such as molybdenum, tungsten, or aluminum could have been used. The thickness of layer 75 is between about 2,000 and 3,000 Angstroms with about 2,000 Angstroms being preferred.

Figure 8:
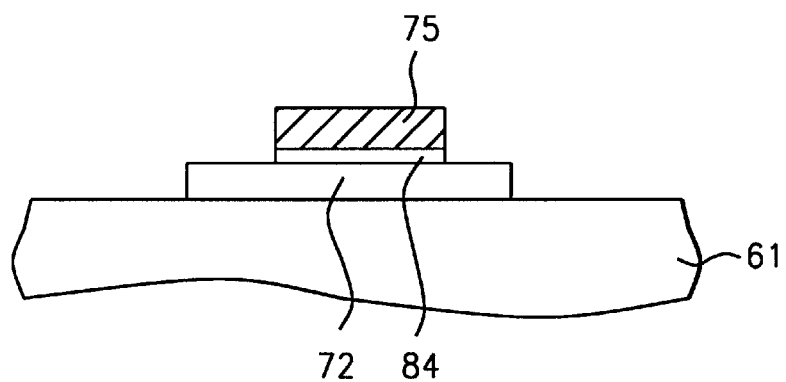
FIG. 8 shows the structure of FIG. 7 after the removal of all unprotected gate oxide.

Using gate pedestal 75 as its own mask, all of layer 74 that does not underlie 75 is etched away giving the structure the appearance illustrated in FIG. 8. Gate oxide 84 now has the conventional appearance associated with a field effect transistor structure.

Figure 9:
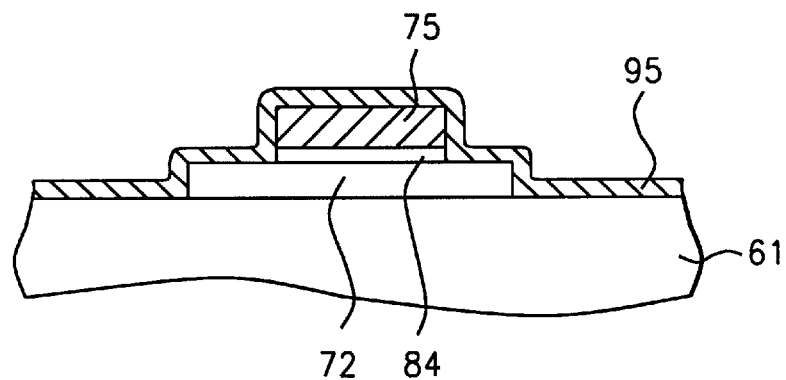
FIG. 9 is the structure of FIG. 8 covered by a layer of N+ amorphous silicon.
Figure 10:
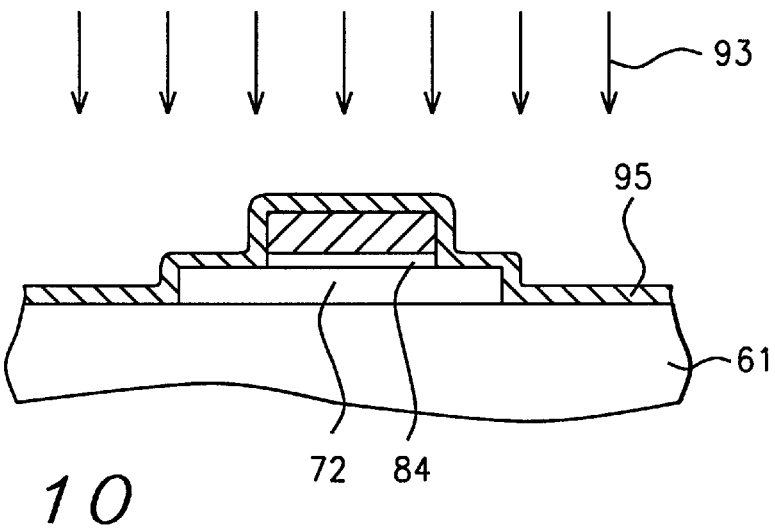
FIG. 10 illustrates the use of laser scanning to drive in material.

Referring now to FIG. 9, N+ layer 95 of amorphous silicon is deposited over the entire surface as illustrated in the figure. This is followed by a laser scan shown symbolically in FIG. 10 by arrows 93. The energy level for this first scan is relatively low being between about 100 and 150 mJ/cm$^2$ with about 130 being preferred. The result of this low energy laser scan is to convert all of polysilicon layer 72 that is in direct contact with N+ layer 95 to N− material.

Figure 11:
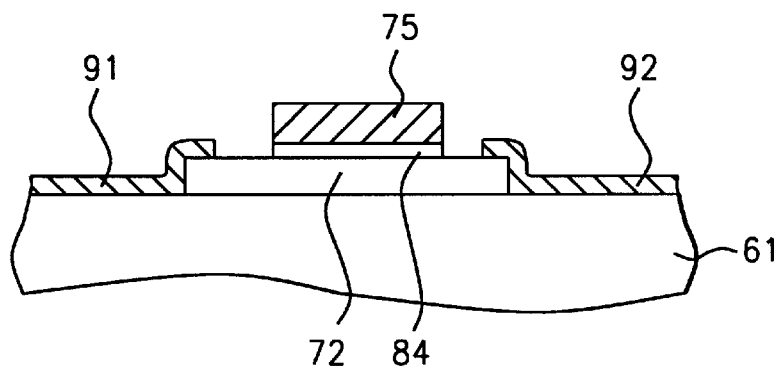
FIG. 11 shows the structure after the source and drain regions have been formed.

Layer 95 is now patterned and etched to form source and drain electrodes 91 and 92 respectively. This is shown in FIG. 11.

Figure 12:
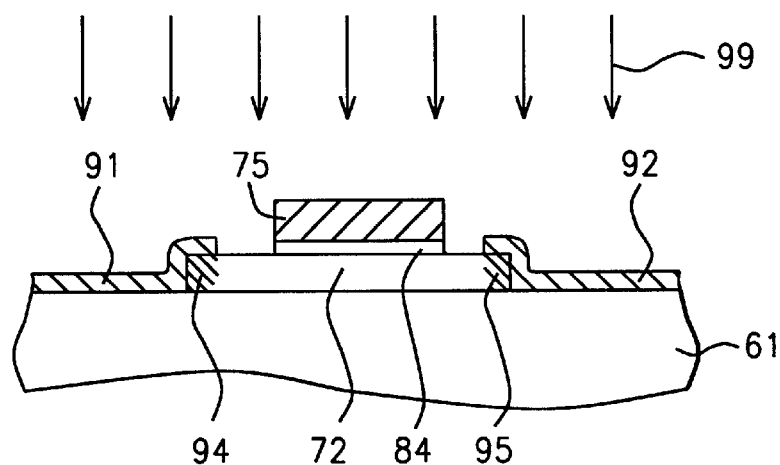
FIG. 12 shows the completed structure, including portions of the polysilicon layer, being transformed to high conductivity regions.

Finally, the structure is subjected to a second laser scan (shown symbolically as arrows 99 in FIG. 12) at a higher energy than the previous scan. In this case the scan energy was between about 170 and 250 mJ/cm$^2$ with about 190 being preferred. As a result, dopant material from 91 and 92 diffuses into polysilicon 72 to form heavily doped polysilicon regions 94 and 95. Thus, as in the first embodiment, a structure of the LDD type has been produced since the source in drain have low resistivity to the edges of regions 94 and 95 and high resistivity between these and the edge of the gate oxide/ gate pedestal. Generally, the distance between 94 (or 95) and the gate was between about 1 and 4 microns with about 3 microns being preferred.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing a thin film transistor, comprising the sequential steps of:

depositing a layer of a metal on an insulating substrate;

patterning and etching said metal layer to form a gate pedestal;

depositing a layer of gate oxide;

depositing a layer of undoped amorphous silicon;

depositing a layer of barrier oxide;

etching the barrier oxide into a pattern that overlies the metal gate, and only the metal gate;

depositing a layer of N+ amorphous silicon;

at a first energy level, laser scanning the N+ silicon thereby transforming the undoped amorphous silicon to N− amorphous silicon wherever N+ silicon is in direct contact with undoped silicon;

patterning and etching the layer of N+ amorphous silicon to form electrodes that do not overlie the gate pedestal;

removing the barrier oxide; and at a second energy level, greater than said first energy level, laser scanning all exposed surfaces, thereby transforming all exposed amorphous silicon, including said electrodes, to polysilicon.

2. The process of claim 1 wherein said metal is selected from the group consisting of chromium, molybdenum, tungsten, and aluminum.

3. The process of claim 1 wherein the metal layer is deposited to a thickness that is between about 2,000 and 3,000 Angstroms.

4. The process of claim 1 wherein said layer of gate oxide is deposited to a thickness that is between about 1,000 and 2,000 Angstroms.

5. The process of claim 1 wherein the layer of undoped amorphous silicon is deposited to a thickness that is between about 200 and 1,000 Angstroms.

6. The process of claim 1 wherein the layer of barrier oxide is deposited to a thickness that is between about 1,500 and 2,000 Angstroms.

7. The process of claim 1 wherein the layer of N+ amorphous silicon is deposited to a thickness that is between about 100 and 500 Angstroms.

8. The process of claim 1 wherein said first energy level for laser scanning is between about 100 and 170 mJ/cm$^2$.

9. The process of claim 1 wherein said second energy level for laser scanning is between about 170 and 350 mJ/cm$^2$.

10. The process of claim 1 wherein the gate pedestal has a width between about 0.5 and 20 microns and a length between about 3 and 20 microns.

11. A process for manufacturing a TFT having a shape, comprising the sequential steps of:

depositing a layer of undoped amorphous silicon on an insulating substrate;

transforming said layer of amorphous silicon to a layer of polysilicon;

patterning and etching the layer of polysilicon into said TFT shape;

overcoating the shaped polysilicon with a layer of gate oxide;

depositing a metal layer over the layer of gate oxide and then patterning and etching the metal to form a gate electrode;

etching all gate oxide not covered by the gate electrode;

depositing a layer of N+ amorphous silicon;

at a first energy level, laser scanning layer the N+ silicon, thereby transforming all undoped polysilicon that is in direct contact with the N+ amorphous silicon to N− silicon;

patterning and etching the layer of N+ amorphous silicon to form source and drain contacting electrodes; and at a second energy level, greater than said the first energy level, laser scanning all exposed surfaces, thereby transforming all N− amorphous silicon that is in direct contact with said source and drain electrodes to N+ silicon.

12. The process of claim 11 wherein said layer of undoped amorphous silicon has a thickness between about 200 and 1,000 Angstroms.

13. The process of claim 11 wherein the step of transforming the amorphous silicon to polysilicon further comprises laser scanning at an energy level between about 250 and 350 mJ/cm$^2$.

14. The process of claim 11 wherein said layer of gate oxide has a thickness between about 1,000 and 2,000 Angstroms.

15. The process of claim 11 wherein the metal is selected from the group consisting of chromium, molybdenum, tungsten, and aluminum.

16. The process of claim 11 wherein the metal layer has a thickness between about 2,000 and 3,000 Angstroms.

17. The process of claim 11 wherein the layer of N+ amorphous silicon has a thickness that is between about 100 and 500 Angstroms.

18. The process of claim 11 wherein said first energy level for laser scanning is between about 100 and 170 mJ/cm$^2$.

19. The process of claim 11 wherein said second energy level for laser scanning is between about 170 and 250 mJ/cm$^2$.

* * * * *